United States Patent [19]

Rudish et al.

[11] 4,341,999
[45] Jul. 27, 1982

[54] HIGH ACCURACY PHASE SHIFT CONTROL SYSTEM

[75] Inventors: Ronald M. Rudish, Commack; Peter J. McVeigh, Hauppauge, both of N.Y.

[73] Assignee: Eaton Corporation, Cleveland, Ohio

[21] Appl. No.: 181,457

[22] Filed: Aug. 25, 1980

[51] Int. Cl.³ .............................................. H03K 5/13
[52] U.S. Cl. ..................................... 328/155; 333/18; 333/156; 307/511
[58] Field of Search ................. 328/55, 155; 307/511; 333/109, 156, 16, 17, 18

[56] References Cited

U.S. PATENT DOCUMENTS

| | | | |
|---|---|---|---|
| 2,284,612 | 5/1942 | Green et al. | 333/16 |
| 3,013,224 | 12/1961 | King | 333/18 |
| 4,024,460 | 5/1977 | Vifian | 328/155 |
| 4,039,930 | 8/1977 | Lukas | 328/155 X |
| 4,309,649 | 1/1982 | Naito | 328/155 X |

Primary Examiner—John S. Heyman
Attorney, Agent, or Firm—Kevin Redmond

[57] ABSTRACT

The phase shift imparted to a signal is accurately controlled by passing the signal through a phase shifter in which the phase shift is adjusted by an automatic feedback control circuit. The control circuit senses the actual phase through the phase shifter and combines this information with a signal representing the desired phase to generate a control signal for the phase shifter.

6 Claims, 4 Drawing Figures

HIGH ACCURACY PHASE SHIFT CONTROL SYSTEM

BACKGROUND

1. Field

This invention relates to means for shifting the phase of a signal and, more particularly, to such systems where high accuracy and automatic control are desired.

2. Prior Art

There are three principal classes of prior art system. In the first, the phase shift imparted to a signal of interest is carried out by open loop means. In such systems, there is no measurement of the actual phase shift through the phase shifter, no determination of errors between the command and the actual phase shift imparted, nor any means of correcting such errors.

In the second prior art system, feedback circuitry is incorporated to control the phase shift of a signal of interest, but the phase shift is not measured directly. Instead, a secondary parameter, such as flux, is measured and relied upon to determine the phase imparted by the phase shifter. Unfortunately, there are uncorrected differences between the actual phase and that indicated by secondary parameters. These differences are principally due to changes in the relationship between the phase and the secondary parameter occurring with changes in temperature, time and frequency.

A third class of prior art systems is illustrated in FIG. 1. In this systems, the imparted phase shift produced by the shifter is measured, but it is not a direct measurement of the signal of interest. Instead, the phase of a second or collateral signal is measured. The collateral signal is passed through the phase shifter along with the signal of interest.

In FIG. 1, the signal of interest $f_1$ and the collateral signal $f_c$ are applied to the input port 101 where they pass through phase shifter 103 to output port 102. The signals applied to the input port are sampled by a directional coupler 104 and supplied to a filter 111. The signals at the output port are similarly sampled by a directional coupler 105 and applied to a second filter 110. The filters 110 and 111 pass only the collateral signals $f_c$. After passing through filters 110 and 111 the collateral signals are then passed through lines 107 and 109 to phase detector 106. The output of the phase detector is fed back to the control port of phase shifter 103 to adjust the phase imparted to the signal $f_1$.

In passing through the phase shifter 103, the collateral signal is shifted in phase by an amount $\phi$ which is similar to the shift in phase of the signal of interest $f_1$. For the phase shift to be similar, the parameters of the phase shifter 103 must be uniform across the frequency range between $f_1$ and $f_c$. If the path length, represented symbolically as $L_1$ (107), from the input port through the filter 111 to the phase detector, were equal to the path length $L_2$ (109), from the input port through the filter 110 to the phase detector, the difference in phase between the two samples of the collateral signal would be due to the phase shifter and would be measured directly by the phase detector. However, the path lengths are intentionally offset by a definite amount referred to as the reference length 108. As the frequency of $f_c$ is changed, the phase reaching the phase detector is changed because of the offset in line lengths. By changing the frequency of the collateral signal, the control signal produced at the output of the phase detector will change, causing the phase shifter to impart a phase shift to the signal $f_1$ determined by the frequency $f_c$.

The operation of the feedback circuit shown in FIG. 1 is dependent on the type of phase shifter used. There are two types of electronically controlled phase shifters in common use. The first is the latching phase shifter which is typically a ferrite phase shifter. In this type of shifter the phase is continuously changed for as long as the control signal is applied. The phase stops shifting when the signal is discontinued.

The second type of phase shifter is the nonlatching phase shifter which is typically a varactor phase shifter in which the phase shift is dependent upon the magnitude of the applied control voltage. If the voltage is removed, the phase will change to that which corresponds to zero voltage.

For the system of FIG. 1 to operate with a latching type phase shifter, the phase detector output must go to zero once the phase shifter 103 imparts the desired phase angle. For the sake of phase comparison, the effective phase shift for the portion of the collateral signal passing through filter 111 is due to the reference length 108, while the effective phase shift for collateral signal passing through filter 110 is $\phi$ imparted by the phase shifter, as the remaining lengths in each path are taken as equal. When the phase shift due to the reference line 108 is equal to the phase shift through the phase shifter 103, the phase detector will receive two signals at the same phase angle and produce a zero voltage output signal. This will stop any further change in the shifter 103. The phase shifter will then have been set to the angle determined by the frequency of the collateral signal and the path length of the reference line. Drift from this phase angle by the shifter will produce a difference in phase at the inputs to the phase detector and a corresponding corrective control voltage at the output of the phase detector.

Although not shown as separate components, all systems illustrated in the Figures are considered as having the usual amplification, buffering and shaping networks contained within the phase detector to drive the phase shifter to the desired position as is normally required in a feedback control network.

Where a nonlatching phase shifter is used, the feedback operation is similar except a slight offset from zero output from the phase detector will be amplified by amplifiers within the phase detector to set the phase shifter 103 to the desired phase angle. The stable point for this feedback systems occurs where the phase shifter 103 is essentially at the desired angle.

A variation of the system shown in FIG. 1 is shown in FIG. 2. In this Figure, the signal of interest $f_1$ is passed from input port 201 through phase shifter 203 to output port 202. A sample of the input signal $f_1$ is coupled through directional coupler 204 to a first mixer 211, while a portion of the output signal is coupled through a second directional coupler 205 to a second mixer 212. The local oscillator signal for both the first and second mixers is a collateral signal $f_c$. The output of the first and second mixers is supplied to the phase detector 206 which produces at its output a control signal for the phase shifter 203.

In a manner similar to that shown in FIG. 1, the basic line lengths to the phase detector are equal. That is, $L_1$ (207) is equal to $L_2$ (209) and there is a reference length 208 added in series with the output of the first mixer 211 to provide a phase shift with frequency. As the collateral signal $f_c$ is varied, the frequency of the output from the mixers varies and the unequal line lengths due to the addition of reference line 208 produces a shift in phase used to control the phase of the shifter in the same manner as line length 108 in FIG. 1.

The circuit of FIG. 2 has several advantages over the circuit of FIG. 1. Only a single signal, $f_1$ is applied to the input port and passed through phase shifter, eliminating the need for the phase shifter to have a uniform phase across a frequency range. Also eliminated is the need for filters and for injecting two signals into the input ports simultaneously.

On the other hand, the circuit of FIG. 2 has the disadvantages of requiring two mixers, a collateral signal source and a means of supplying it to the two mixers. In the circuits of FIG. 1 and of FIG. 2, the phase of the signal of interest $f_1$ is not measured directly. As a result, the circuitry suffers in accuracy, complication and expense.

SUMMARY

In the present invention the phase of the signal of interest is measured directly to provide a means of accurately controlling the phase imparted by an electronically controlled phase shifter.

The signal of interest is sampled before and after passing through the electronically controllable phase shifter. The samples are compared in a phase detector to produce an output signal which is fed to the control port of the phase shifter to adjust phase angle imparted.

The desired phase may be entered into this system by two methods. In the first, a phase shift is entered into one of the lines supplying the phase detector. In the second, a voltage representing the desired phase is added to the output signal of the phase detector. In both methods, the actual phase imparted by the shifter is measured and any deviation from the desired phase causes a correction in the control voltage to be generated automatically which directly corrects the phase of the signal of interest.

DETAILED DESCRIPTION OF THE INVENTION

Figure 1:
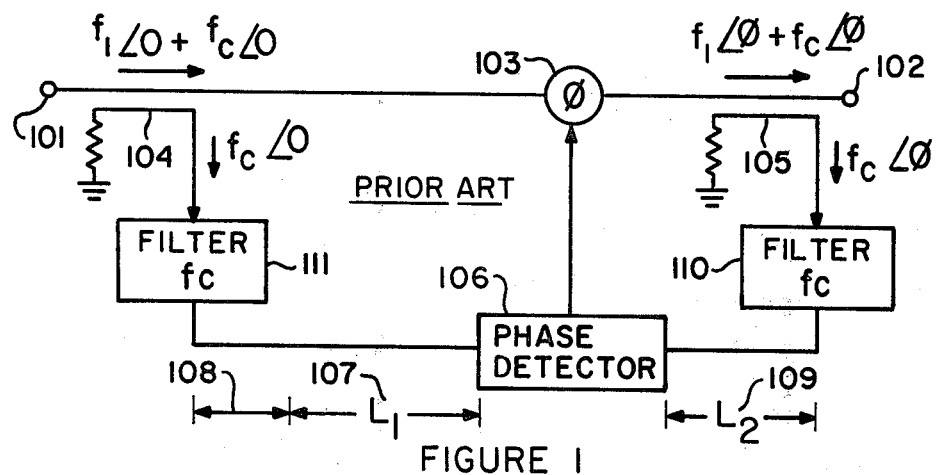
FIG. 1 is a diagram of a first prior art system.
Figure 2:
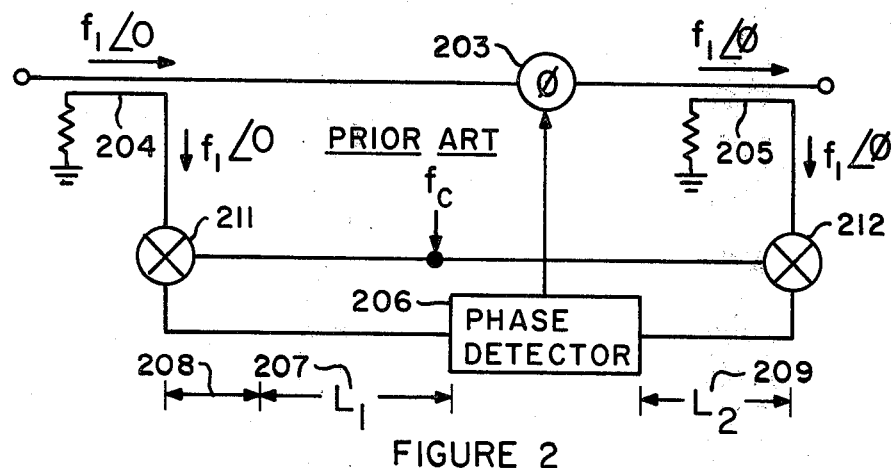
FIG. 2 is a diagram of a second prior art system.
Figure 3:
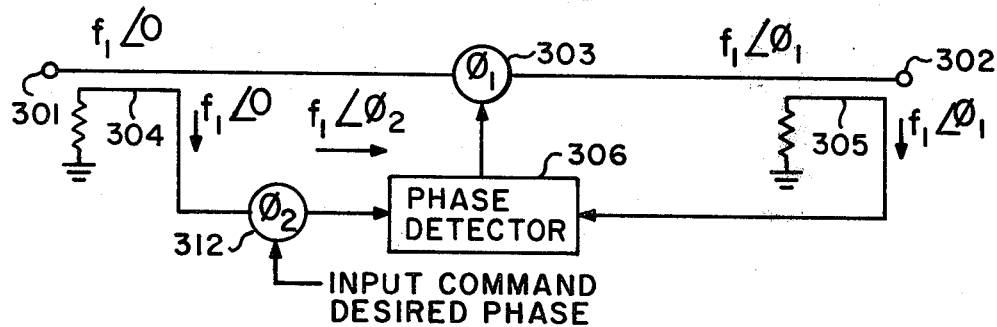
FIG. 3 is a diagram of a first embodiment of the present invention.

FIG. 3 illustrates a first embodiment of the present invention. In this Figure, a signal of interest $f_1$ is applied to the input port 301 and passed through the phase shifter 303 to an output port 302. A portion of the input signal is sampled by way of a directional coupler 304 and applied to the phase detector 306, while a portion of the output signal is sampled by way of a directional coupler 305 and applied to the phase detector 306. Inserted in the line between the directional coupler 304 and the phase detector is a second phase shifter 312. The input command indicating the desired phase is applied to the second phase shifter 312.

Where equal path lengths from the input port 301 to the phase detector are used, the signals arriving at the phase detector will differ by the phase shift produced by the phase shifters 303 and 312. When these are equal the output of the phase detector will be zero. In the case of a latching type phase shifter, this arrangement causes the phase shifter 303 to be driven by the output of the phase detector until its phase angle is equal to that of phase shifter 312. In effect, phase shifter 303 is "slaved" to phase shifter 312. With this arrangement, a high power, low accuracy phase shifter may be made to provide the accuracy of a low power, precision phase shifter.

As noted earlier, where a nonlatching phase shifter is used, the feedback operation is similar except a slight offset from zero output from the phase detector will be amplified by amplifiers within the phase detector to set the phase shifter 303 to the desired phase angle. The stable point for this feedback system occurs where the phase shifter 312 is essentially at the desired angle.

Figure 4:
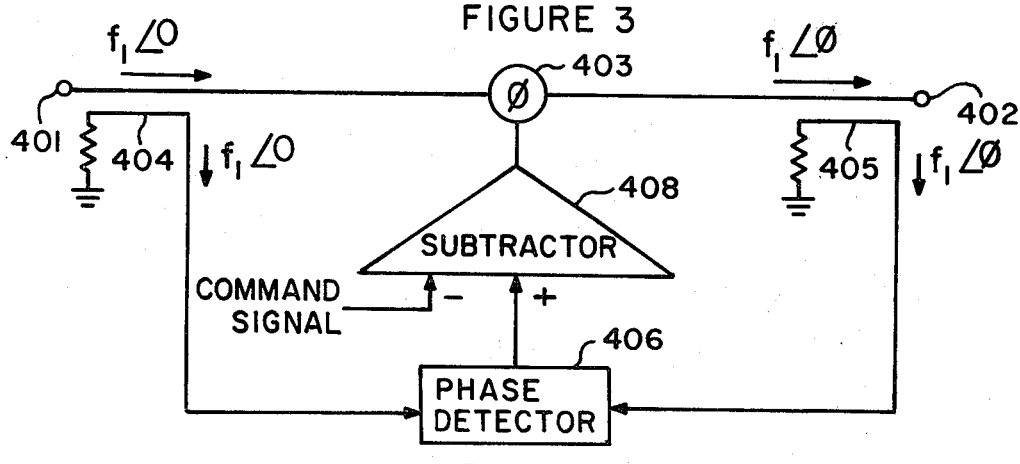
FIG. 4 is a diagram of a second embodiment of the present invention.

The second embodiment of the present invention is shown in FIG. 4. In this Figure, a signal of interest $f_1$ is applied to input port 401 and is passed through phase shifter 403 to output port 402. A sample of the input signal is coupled from the input port 401 by means of a directional coupler 404 and supplied to phase detector 406. A sample of the output signal is coupled from the output port 402 by means of a directional coupler 405 and supplied to the phase detector 406 by way of directional coupler 405. The phase detector output is supplied to subtractor 408. A command signal which is a voltage indicating the desired phase angle is applied to the subtractor 408. The subtractor, which takes the difference between the command signal and the phase detector output, supplies a signal to the control port of the phase shifter 403.

Where a latching type phase shifter is used, the command signal will exactly cancel the phase detector output, bringing the control voltage to zero and stopping any further change in the phase shifter. The phase shifter will then be at the desired angle.

Where a nonlatching phase shifter is used, the command signal will almost cancel the output of the phase detector and the resulting difference in voltage between the command signal and the output of the phase detector will be amplified to a voltage which virtually sets the phase shifter at the desired angle.

Other equivalent methods of precisely controlling the phase shift of a signal are considered within the scope and spirit of the invention. For example, it is possible to convert the output of the phase detector to digital form and pass this signal and a command signal in digital form to a digital subtractor which performs the identical function as the analog subtractor described above. The output of the digital subtractor may be used directly in digital form to control a digital phase shifter.

Having described the invention, we claim:

1. Apparatus for accurately controlling the phase of a first signal comprising:
   (a) means for shifting the phase of the first signal, said means for shifting having an input, an output and a control port, the first signal being applied to the input port and extracted from the output port with a phase shift determined by a second signal, which is applied to the control port,
   (b) first means for sampling a portion of the first signal, connected to the input port of said means for shifting the phase,
   (c) second means for sampling a portion of the first signal connected to the output of the means for shifting the phase,
   (d) means for sensing phase having a first and second input port and an output port, the first input port being connected to the first means for sampling while the second input port is connected to the second means for sampling to accept and determine the phase difference between the sampled signals and produce at the output port of the means for sensing phase the second signal related to the phase difference of the sampled signals, (e) second phase shifting means designated the reference phase shifting means having an input port and output port and a control port, the second phase shifting means connected in series between one of the sampling means and the phase sensing means to shift the phase of one of the sampled signals in accordance with an independent fourth signal applied to the control port of the reference phase shifting means, and (f) means for applying said second signal from the output of the means for sensing phase to the control port of the first means for shifting the phase to drive the first phase shifting means to the phase angle of the reference phase shifting means.

2. Apparatus as claimed in claim 1, wherein the means for shifting the phase is of the nonlatching type which produces a phase shift related to the amplitude of the second signal and said means for sensing phase produces the second signal with an amplitude to set the means for shifting the phase at the phase indicated by the fourth signal.

3. Apparatus as claimed in claim 1, wherein the means for shifting the phase is of the latching type in which the phase continues to shift as long as there is a second signal applied and ceases to shift as soon as the second signal is removed and said means for sensing phase continues to produce a second signal until the phase of the means for shifting the phase is at the phase indicated by the fourth signal.

4. Apparatus for accurately controlling the phase of a first signal comprising:

(a) means for shifting the phase of the first signal, said means for shifting having an input, an output and a control port, the first signal being applied to the input port and extracted from the output port with a phase shift determined by a second signal, which is applied to the control port, (b) first means for sampling a portion of the first signal connected to the input port of the means for shifting the phase, (c) second means for sampling a portion of the first signal connected to the output of the means for shifting the phase, (d) phase sensing means having a first and second input ports and an output port, the first input port being connected to the first means for sampling while the second input port is connected to the second method for sampling to accept and determine the phase difference between the sampled signals and produce at the output port of the phase sensing means a third signal related to the phase difference of the sampled signals, and (e) means for subtracting two signals, said means for subtracting having two input ports and an output port and accepting at one input port an independent signal designated the command signal which indicates the desired phase of the means for shifting the phase, and accepting at the second input port the third signal indicating the present phase of the means for shifting the phase to produce at the output port of the means for subtracting the second signal which is applied to the control port of the means for phase shifting to drive it to the desired phase.

5. Apparatus as claimed in claim 4, wherein the means for shifting the phase is of the nonlatching type which produces a phase shift related to the amplitude of the second signal and said means for subtracting produces the second signal with an amplitude to set the means for shifting the phase at the phase indicated by the command signal.

6. Apparatus as claimed in claim 4, wherein the means for phase shifting is of the latching type in which the phase continues to shift as long as there is a control signal applied and ceases to shift as soon as the control signal is removed and said means for subtracting continues to produce a control signal at its output port until the phase of the means for shifting the phase is at the phase indicated by the command signal.

* * * * *